US006683962B1

(12) United States Patent
Griesinger

(10) Patent No.: US 6,683,962 B1
(45) Date of Patent: Jan. 27, 2004

(54) METHOD AND SYSTEM FOR DRIVING SPEAKERS WITH A 90 DEGREE PHASE SHIFT

(75) Inventor: David H. Griesinger, Cambridge, MA (US)

(73) Assignee: Harman International Industries, Incorporated, Northridge, CA (US)

(*) Notice: Subject to any disclaimer, the term of this patent is extended or adjusted under 35 U.S.C. 154(b) by 0 days.

(21) Appl. No.: 09/217,770

(22) Filed: Dec. 21, 1998

Related U.S. Application Data

(60) Provisional application No. 60/068,716, filed on Dec. 23, 1997.

(51) Int. Cl.[7] .................................................. H03G 1/00

(52) U.S. Cl. ................................ 381/97; 381/1; 381/98

(58) Field of Search ................................ 381/96, 1, 97, 381/98

(56) References Cited

U.S. PATENT DOCUMENTS

| | | | | |
|---|---|---|---|---|
| 4,356,349 A | * 10/1982 | Robinson | ..................... | 369/88 |
| 4,403,112 A | 9/1983 | Modafferi | | |
| 4,590,248 A | 5/1986 | Moriya et al. | | |
| 4,623,708 A | 11/1986 | Ezrielev et al. | | |
| 4,841,572 A | 6/1989 | Klayman | | |
| 5,033,092 A | * 7/1991 | Sadaie | ........................ | 381/303 |
| 5,172,415 A | 12/1992 | Fosgate | | |
| 5,233,665 A | 8/1993 | Vaughn et al. | | |
| 5,301,237 A | 4/1994 | Fosgate | | |
| 5,339,363 A | 8/1994 | Fosgate | | |

OTHER PUBLICATIONS

Supplementary European Search Report for European Patent Application No. EP 98966031.1, dated May 7, 2003, 3 pages.

* cited by examiner

*Primary Examiner*—Ping Lee
(74) *Attorney, Agent, or Firm*—Brinks Hofer Gilson & Lione

(57) ABSTRACT

A method and system for providing enhanced coupling of a stereophonic pair of full-range loudspeakers or subwoofers to all room modes of a laterally symmetric listening room wherein the preferred location of a listener is on the lateral center line thereof, by applying the left and right audio signals or the low frequency components thereof through a pair of all-pass phase shift networks having an in-phase relationship at higher audio frequencies and an approximately quadrature phase relationship at low audio frequencies where localization is not possible. The method and system may further be compensated by a 3 dB bass boost in each channel to provide the same sound pressure level at low frequencies as would occur with a pair of subwoofers placed together in one comer of the room and driven in phase, thereby ensuring a constant sound pressure level along the lateral center line of the listening room at all audio frequencies.

15 Claims, 10 Drawing Sheets

METHOD AND SYSTEM FOR DRIVING SPEAKERS WITH A 90 DEGREE PHASE SHIFT

CROSS-REFERENCE TO RELATED APPLICATION

This application is based upon the U.S. Provisional Patent Application No. 60/068,716, entitled "Method and System for Driving Speakers With a 90 Degree Phase Shift," filed Dec. 23, 1997.

FIELD OF THE INVENTION

This invention relates to a method and system of driving a pair of stereo loudspeakers, or a pair of loudspeakers that are part of a multiple loudspeaker array, with a non-zero optimal phase relationship in the low frequency region, approximating 90 degrees in the region where localization becomes impossible. In particular, this method and system allows room modes to be excited independently by both loudspeakers thereby producing a full bass response which may be further modified by a shelf filter to equalize the sound pressure level in the bass frequency range.

BACKGROUND OF THE INVENTION

Stereophonic pairs of loudspeakers are used for sound reproduction in a listening room, and are often called upon to reproduce sound in the low frequency region where localization becomes impossible. Such loudspeakers are commonly used in pairs or multiples, and frequently are in combination with other loudspeakers intended to reproduce the higher audio frequencies.

In some sound systems, known as satellite-subwoofer systems, the upper frequency range is reproduced by a pair of satellite loudspeakers with a limited response below about 200 Hz, the low frequency signals being combined into a single monophonic subwoofer, often placed along the center line of the room. For such systems, this invention has no application. However, when full-range loudspeakers are used, or when a user installs a pair of subwoofers, the present invention, as described in detail below, can provide better performance than the conventional usage wherein the loudspeakers are driven in phase at low frequencies.

When two speakers are driven in phase, the performance of full-range speakers or dual subwoofers can be inferior to that of the satellite-subwoofer system. The satellite-subwoofer system will give identical results when the subwoofer is located along the center line of the room, but more bass (and a more spacious sound) can be obtained if the subwoofer is placed off axis and near a corner of the room. With two subwoofers driven in phase, the best placement is to put both together in the same corner of the room.

In the conventional methods of sound reproduction, a coherent phase relationship between the two loudspeakers has been considered necessary so that "pair-wise mixing" and the use of pan-pots in recording stereophonically will result in correct imaging of the reproduced sounds. There is a large body of literature on the merits of phase coherence in stereophonic reproduction systems, and great pains are taken, not only to match the amplitude and phase response of amplifiers and equalizers, but also to match pairs of loudspeakers.

Nevertheless, much of the literature also asserts that below some low frequency, usually estimated as between 80 Hz and 200 Hz, localization of sounds is not possible. Above this frequency,the amplitude difference between the loudspeakers is the primary localization cue, but along the centerline of a relatively absorptive room the phase relationship also has an effect.

A neglected consequence of these assertions is that there must be some frequency below which the speakers need not be in phase. The question arises of what is the optimal phase relationship below this frequency. Research briefly described herein has indicated that there is a non-zero optimal phase relationship, and that the loudspeakers should ideally have a phase difference of 90 degrees in the low frequency region.

SUMMARY OF THE INVENTION

The present invention is concerned with a method and system for driving a pair of loudspeakers in an appropriate phase relationship in the low frequency region, by means of a phase shifting and equalizing circuit.

One embodiment includes a pair of all-pass phase difference networks optimally producing a quadrature relationship in the low frequency region below about 200 Hz, while maintaining an in-phase relationship at higher frequencies, and additionally includes equalizing networks to introduce a small bass boost to compensate for the ~3 dB reduction in bass energy along the center line of the room that the quadrature circuit often produces.

In another aspect, an electronic signal processing system is provided for driving first and second power amplifiers and first and second loudspeaker systems in a listening room. First and second input terminals are adapted to receive a stereophonic pair of audio input signals. Corresponding first and second output terminals produce a stereophonic pair of output signals for driving the first and second power amplifiers and the first and second loudspeaker systems. Circuitry is provided for varying the phase relationship between said first and second output signals such that their phase difference tends towards zero at high audio frequencies and increases to approximately quadrature or 90 degrees phase difference at low frequencies, the gain of the circuitry between each said input terminal and said corresponding output terminal being approximately constant at all audio frequencies, thereby providing increased apparent spaciousness of low frequency sounds reproduced by said loudspeakers in said listening room.

In another aspect, the signal processing system further comprises a circuit between each input terminal and said corresponding output terminal wherein there is an equal bass boost applied to both said first and second output signals of approximately 3 dB for those frequencies where the phase difference is approximately 90 degrees thereby maintaining approximately constant sound pressure at all frequencies along the lateral center line from front to back of said listening room.

In another aspect, the phase difference of approximately 90 degrees at low frequencies is obtained without active electronics, by combining differences in the loudspeakers themselves, such as differences in enclosure volume, port area, cone mass, surround stiffness, and crossover components.

Although research has shown that relatively steady low frequency sounds are difficult to localize, percussive sounds include higher frequency components that are easier to localize. The ability to localize percussive sounds increases as the frequency rises. The addition of a 90 degree phase shift as provided by this invention sometimes alters the localization of all sounds, and in particular percussive sounds. The 90 degree phase shift results in a time delay in the lagging phase channel, which tends to produce localization shifting towards the leading phase channel. Thus the shift in localization will determine the highest frequency at which the 90 degree phase shift should be applied. For reproduction of classical music, where bass instruments are mostly located on the right of the orchestra as heard by the listener, the leading phase shift should be applied to the right channel to minimize the perception of this effect. However, popular music is typically mixed so that the kick drum (or similar instruments) produces equal levels in both channels, which results in a strongly percussive low frequency sound. When such recordings are played in a laterally symmetric room with phase coherent loudspeakers, the result is a strong in-head localization of the low frequency energy. While this sounds unnatural, it is often considered desirable by recording engineers as evidencing good imaging. The present invention, by reducing in-head localization, may make some of these engineers unhappy. In order to make them happy again, an additional aspect of this invention is additional circuitry that detects rapidly rising (percussive) sound, and temporarily reduces the phase shift.

An advantage of the invention is to provide a richer, fuller bass sound by exciting more room modes. It has been shown that in a laterally symmetric room, the use of a single non-central loudspeaker can excite both odd and even lateral room modes, while a centrally placed loudspeaker cannot excite the odd modes, and the same is true of two loudspeakers driven in phase and symmetrically placed. The sense of spaciousness in the sound reproduction is enhanced, particularly in smaller listening rooms, by exciting both the odd and even lateral modes.

Another advantage of the invention is that it reduces unnatural in-head localization of certain low frequency sounds.

A further advantage of the invention is that it provides an optimal phase relationship between the loudspeakers in the low bass region while maintaining the bass response perceived by the listener by enhancing the base response of the loudspeakers.

An additional advantage of the invention is that it enhances the spaciousness perceived by the listener for low frequency sounds, while maintaining the sound pressure level the same as for two subwoofers in the same corner of the room.

BRIEF DESCRIPTION OF THE DRAWINGS

The novel features believed characteristic of the present invention are set forth in the appended claims. The invention itself, as well as other features and advantages thereof, will best be understood by reference to the following detailed description of an illustrative embodiment when read in conjunction with the accompanying drawing figures, wherein:

DETAILED DESCRIPTION OF EXEMPLARY EMBODIMENTS

Figure 1:
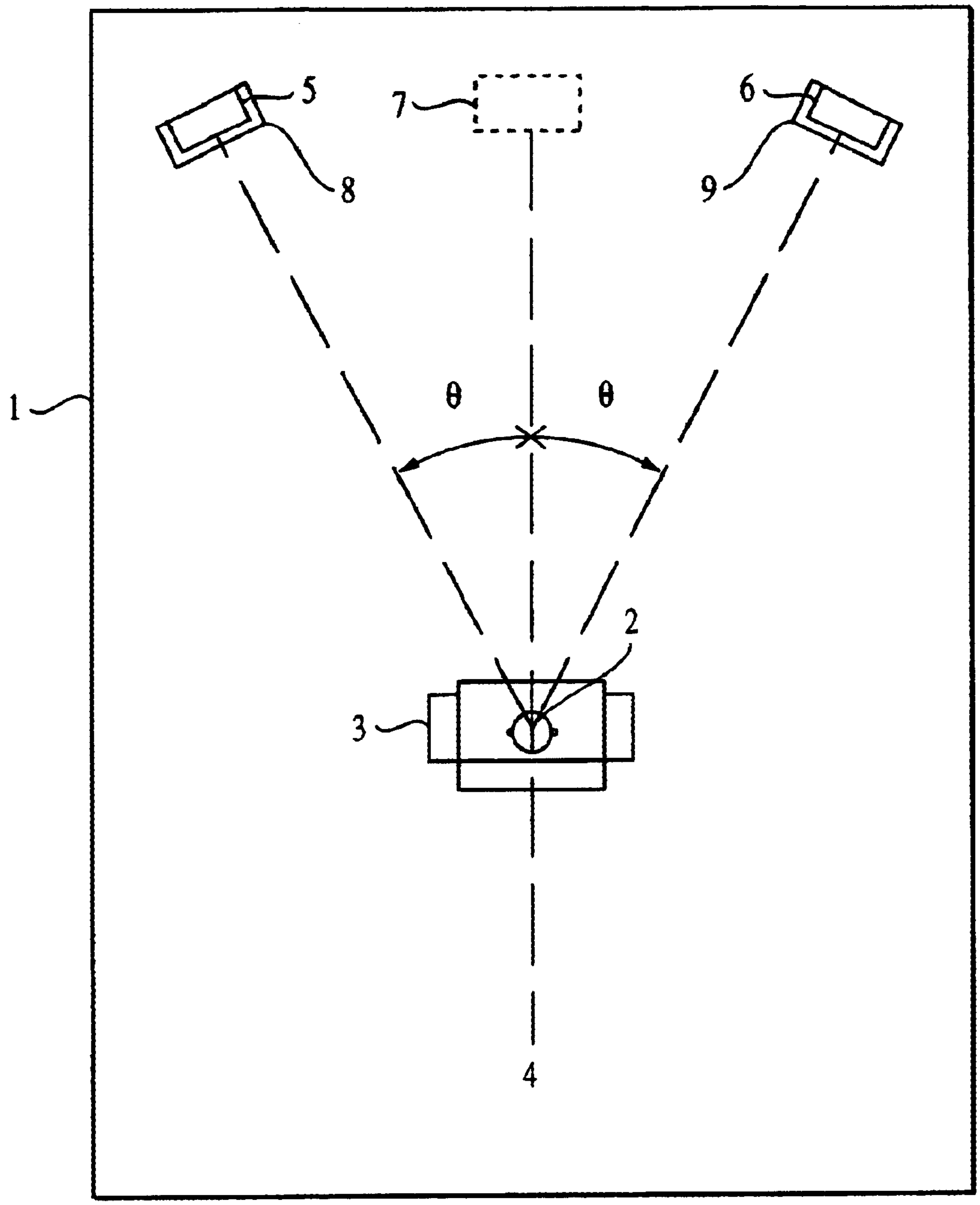
FIG. 1 shows a representation of a typical stereophonic loudspeaker system in a listening room.
Figure 15:
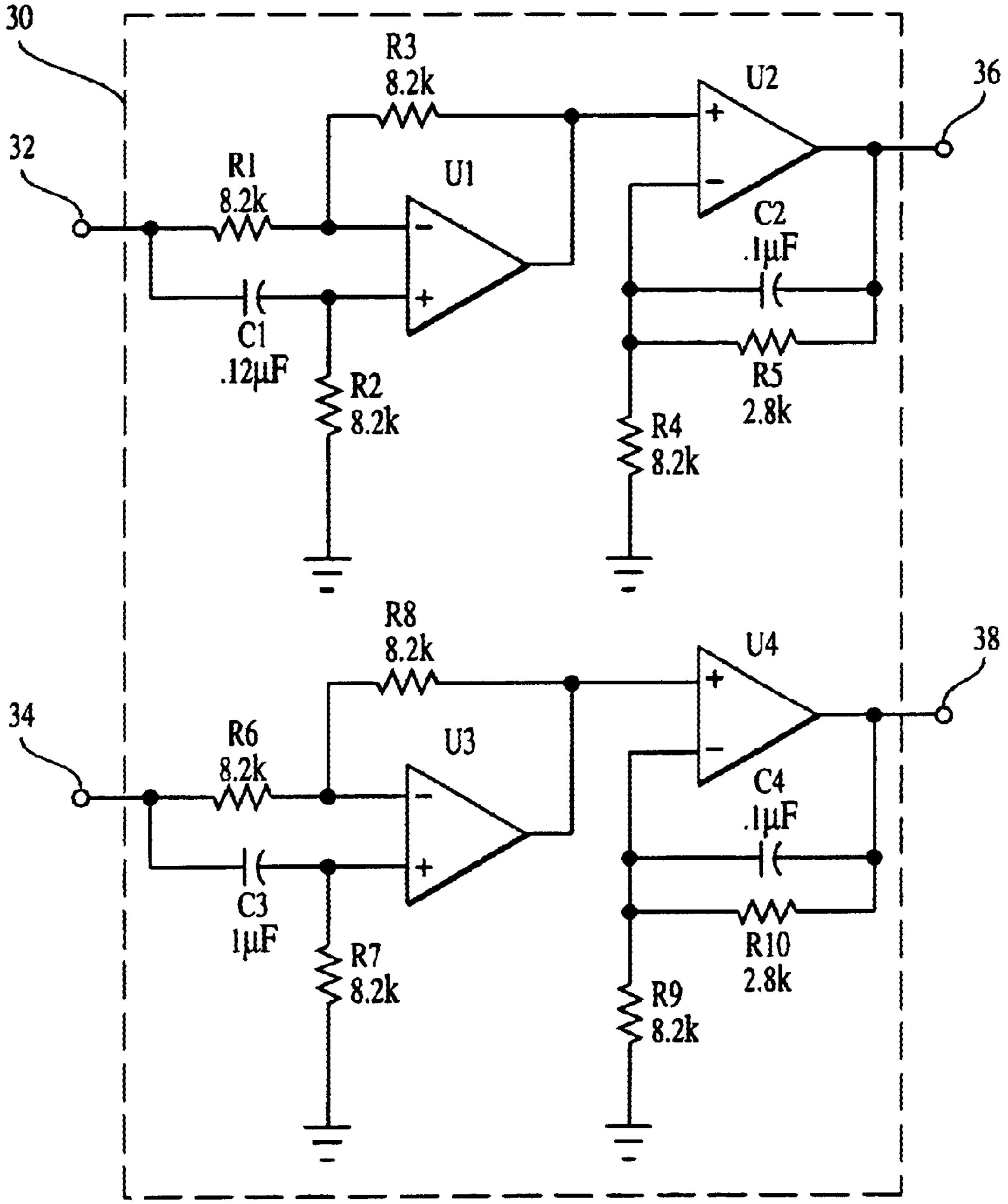
FIG. 15 shows a detailed schematic of a preferred embodiment of the present invention.

Referring to FIGS. 1 and 15, for example, the system and method of the present invention is the result of consideration of various acoustical phenomena which may be described in relation to the listening room and typical audio installation shown in FIG. 1.

The listening room 1 of FIG. 1 shows a listener 2 seated in a preferred listening position 3 that is often on the lateral center line of the room 4. A left speaker 5 and a right speaker 6 are place symmetrically in relation to the center line 4 so that the lines joining them to the listener 2 make equal angles θ with the center line.

In many such listening rooms, the loudspeakers 5 and 6 are full-range loudspeakers, but in some systems, they only reproduce the higher audio frequencies, while the bass frequencies are either combined and fed to a single subwoofer 7 or else are fed separately to two subwoofers 8 and 9 at left and right of the center respectively. The satellite-subwoofer system using a single subwoofer 7 is not the type of system to which this invention can be applied. Although the subwoofer 7, shown dotted, is here placed on the center line, it may be advantageously placed off-center (and preferably towards the right) as will be shown later. Both subwoofers 8 and 9 in FIG. 1 may alternatively be placed in the same corner of the room. One of the purposes of this invention is to make such a placement disadvantageous.

Systems employing either full-range loudspeakers 5, 6, or the combination of satellites 5, 6, with corresponding subwoofers 8, 9, may provide more spacious and natural sound reproduction using the principles embodied in the present invention.

It will be helpful to the background of this invention to investigate the perception of spaciousness in large and small rooms, particularly at low frequencies. In particular, the inventor refers to the following technical papers, incorporated by reference in their entirety, in which he has described such research:

1. Griesinger, D, "Measures of Spatial Impression and Reverberance based on the Physiology of Human Hearing," Proceedings of the 11th International Audio Engineering Society (AES) Conference, May 1992, pp. 114–145.
2. Griesinger, D, "Spaciousness and Envelopment in Musical Acoustics," AES preprint No. 4401, presented at the 101st AES Convention, Nov. 8–11, 1996.
3. Griesinger, D, "The Psychoacoustics of Apparent Source Width, Spaciousness and Envelopment in Performance Spaces," Acta Acustica No. 4, pp. 605–746 July/August 1997.
4. Griesinger, D, "Spatial Impression and Envelopment in Small Rooms," Audio Engineering Society preprint No. 4638, $103^{rd}$ Convention, New York Sep. 26–29, 1997.
5. Griesinger, D, "Speaker Placement, Externalization, and Envelopment in Home Listening Rooms," Audio Engineering Society preprint No. 4860, 105th Convention, San Francisco, October 1998.

Figure 2:
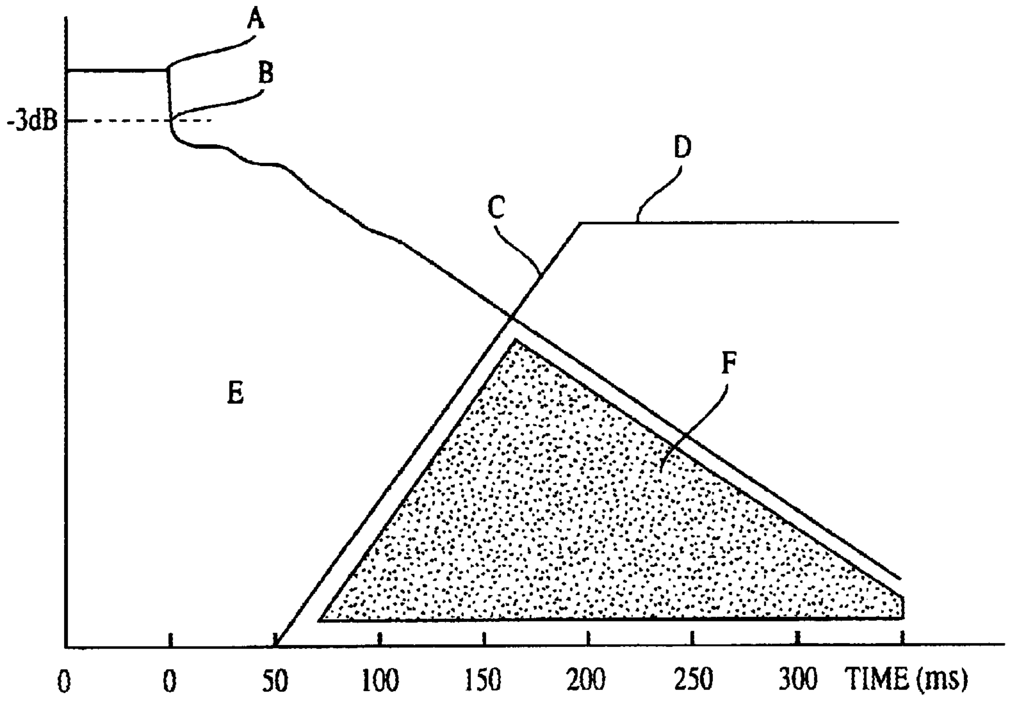
FIG. 2 illustrates the perception of low frequency spaciousness caused after a direct sound decays in a large room, due to background spatial impression (BSI) created by reverberant sounds.

FIG. 2, taken from reference [4], illustrates the phenomenon called background spatial impression, or BSI.

Sounds received at the left and right ear canals are detected and separated into multiple foreground streams and a background stream. The foreground streams comprise sound events having a similar timbre, localization, or meaning, such as speech from a particular speaker, or sounds from a specific musical instrument. Sounds which do not have the coherence that identifies a foreground stream are perceived as a single background stream. It is the spatial properties of this background stream which primarily give rise to the perception of spaciousness and envelopment. Where it is not possible to separate a background stream, fluctuations in interaural time and intensity differences due to delayed lateral reflections create an impression of spaciousness.

The theory of interaural fluctuations and spaciousness perception has been presented at length elsewhere [1, 2, 3]. For the sake of clarity it will be briefly summarized here. Horizontal localization in human hearing is primarily determined by the interaural time differences (ITDs) and intensity differences (IIDs). Delayed lateral reflections interfere with the direct sound and cause the IIDs and ITDs to fluctuate. The amplitude of the fluctuations is on the average proportional to the energy of the reflection. The rate of the fluctuation depends on many factors, among them the bandwidth or frequency vibrato of the musical signal. Fluctuations lower than about 3 Hz are perceived as source motion, and fluctuations faster than this cause either a broadening of the width of the source, or the perception of a narrow source in the presence of a surround.

When direct sound is continuous and cannot be split into separate sound events through variations in amplitude or pitch, reflected energy and the corresponding interaural fluctuations give rise to a sense of envelopment or spaciousness that is perceived as connected to or associated with the direct sound. The surrounding impression can be fully enveloping, fully surrounding the listener. However, as the loudness of the sound source increases, the strength of the surround impression does not change. Changing the direct to reverberant ratio changes the strength of the impression, but changing the overall level does not. This form of spatial impression is called CSI, or continuous spatial impression.

When the incoming sound consists of separable sound events that can be formed into a foreground stream, the perception of spaciousness splits into two different forms depending on the delay of the reflections. Reflected energy that arrives during a sound event, and within 50 ms of the end of the sound event, is perceived as part of the sound event itself. We call this spatial impression ESI, or early spatial impression. ESI, like CSI, does not change as the strength of the source is varied. However, unlike CSI, ESI is usually not fully enveloping. ESI is perceived as strongly occupying the same direction as the source sound.

ESI is the spatial impression of small rooms. We are not usually aware of ESI, but one can train oneself to hear it. When you listen to another person talk in a small room you can be very much aware that you are in a small room. However, the sound of the room is perceived as being in the same direction as the speaker. The room impression is bound to the sound of the voice itself. ESI is neither spacious nor enveloping.

When the room is large enough or reverberant enough that a substantial amount of the reflected energy arrives more than 50 ms after the ends of the direct sound events, background spatial impression (BSI) is perceived. Background spatial impression arises from sound that arrives at least 50 ms after the end of the direct sound. If this delayed energy is spatially diffuse (coming from all directions) then the fluctuations in the IID and the ITD are maximum, and a strong sense of envelopment results.

Unlike ESI and CSI, BSI is not bound to the direct sound that creates it. BSI is perceived as separate from the direct sound, and as independent of the direct to reverberant ratio. BSI depends strongly on the absolute strength of the source, as well as on the reverberant level and the profile of the decay. To produce BSI it is essential to have a stream of direct sound events. BSI does not occur during the decay of a single sound event (or during the decay at the end of a piece of music.) The decay of a single sound event is itself an event—one can devote one's full perceptive powers to it. BSI can only be heard in the gaps between foreground events, and has distinct properties different from foreground events. For example, if BSI has a pitch, it can have only one pitch. A foreground event, such as the decay of a chord, can be heard as a combination of pitches.

In the acoustics of small rooms, as in the acoustics of large rooms, we are primarily interested in BSI when we speak of envelopment. Thus we are interested in the spatial properties of sound which is at least 50 ms delayed. In fact, the sensitivity of the ear to BSI rises to a maximum at about 160 ms, after the ends of foreground sound events.

In listening rooms there is very little energy in the room 160 ms after the ends of sound events. Thus if we are to have BSI at all, it must be supplied by the recording. It is the reverberant component of a sound recording that produces BSI in a small room. FIG. 2 shows how the detection process works.

The actual end of a sound, A, is perceived typically by the listener when the sound has decayed to half power or about −3 dB, at B in FIG. 2. As the sound dies away, shown by the gradually sloping line from B to the lower right of the figure, the sensitivity of the ear to reflections and reverberances from other directions enveloping the listener, the background sensitivity, follows the line C, increasing to a maximum value D. In the region E to the left of this line, the reflections contribute to ESI and CSI, but after 50 ms from the end of the event, reflections in the shaded area F result in BSI, with their maximum at about 160 ms after the end of the direct sound. Thus, there must be a sufficiently long gap after the end of the sound to allow for perception of the BSI effect.

Figure 3:
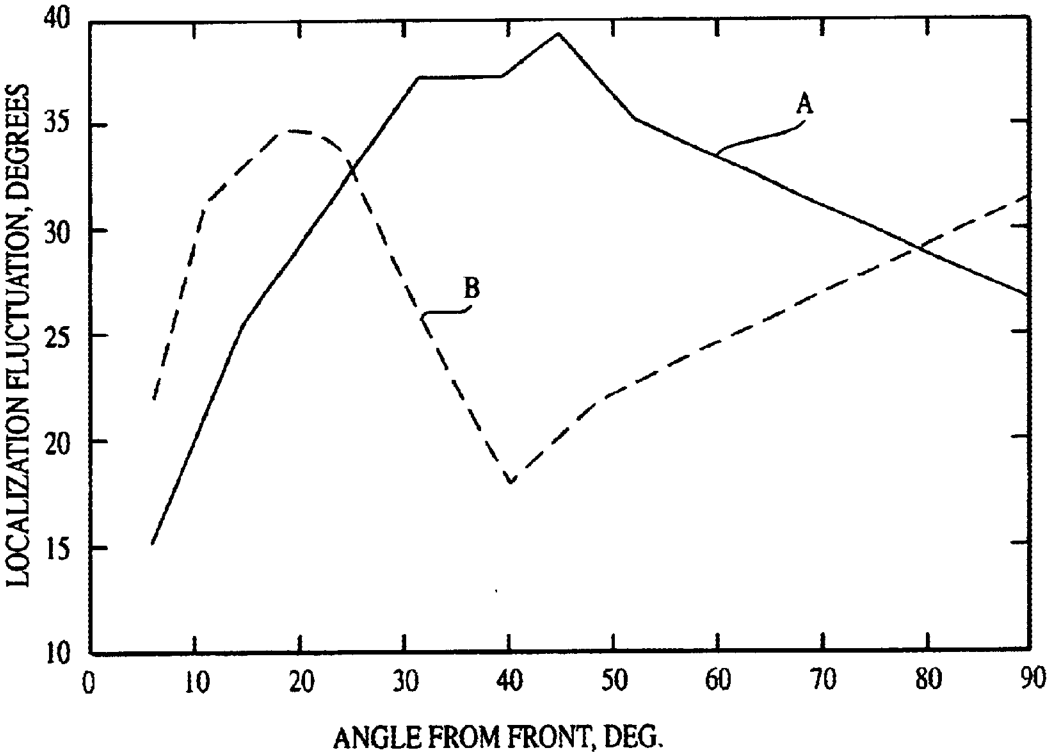
FIG. 3 show the effect of interfering delayed lateral sound reflections in a reverberant room causing localization fluctuations, as a function of angle from the front, which results in an impression of spaciousness.

The perception of localization fluctuations which result in ESI and CSI effects is illustrated by the curves in FIG. 3, which were obtained from a computer simulation. Spaciousness in small rooms where there are no long-delayed reflections is mainly due to these ITD and IID fluctuations. In this figure, the localization fluctuations depend strongly on the angle of a single reflection from the front, as shown in curve A for a frequency of 1000 Hz, reaching a maximum at about 45 degrees. The dotted curve B shows the maxima at about 22 degrees and at 90 degrees. At low frequencies, the optimum angle for a single reflection is fully to the side of the listener, at 90 degrees.

This angular dependence of the interaural fluctuations is a key to understanding spatial impression in sound reproduction systems at high frequencies. As an example, if a continuous broadband stereo signal such as applause is played through a standard stereo speaker system outdoors or in an anechoic chamber, the listener is centered, and the speakers subtend +/−30 degrees, because the sound is continuous we expect that the spatial impression will be that of CSI. CSI at high frequencies is usually fully enveloping, it sounds as if it is coming from all around the listener. However, it can be weak if the reflected energy which creates it comes from the medial plane. In this example, we are assuming we have very little reflected energy. The fluctuations, if present at all, must be generated from the direct sound.

When we perform this experiment we perceive an image of the applause located between the loudspeakers. This is what we expect. However, this perception is accompanied by a fully enveloping surround. The presence of sound that clearly comes from the sides of the listener when there is no source of sound from the sides is uncanny. On first hearing this, one might assume that there had to be some sort of crosstalk canceller in the system, but this is not the case. The experiment clearly shows that it is possible for two loudspeakers at +/−30 degrees (or less) to produce a fully enveloping signal with no electronic or acoustic support.

The reason is that at some frequency bands the speakers are at the optimum angle for producing interaural fluctuations. In our example the optimum frequencies will be about 1500 Hz, which is just in the middle of our hearing system's maximum sensitivity for speech perception. CSI in this band will be very strongly heard. Passing the applause through a variable band pass filter confirms the result. Applause limited to below 500 Hz produces no surround from the stereo pair. As the frequency is increased to the 1500 Hz band a very strong surround is generated. As the frequency rises further the surround impression decreases, only to rise again at about 3000 Hz. The theory of interaural fluctuations predicts this pattern.

Thus a stereo pair can produce a strong sense of surround with no acoustic support from the room, at least at frequencies of about 1000 to 2000 Hz. Such a speaker pair is also capable of producing BSI, if the reverberant component of the recording is fully decorrelated in the left and right speakers. The degree of correlation of the reverberation is important. If the reverberation is monaural the sound from the two loudspeakers will not cause the ITD and IID at the listener's ears to vary. No CSI or BSI will be produced regardless of frequency. In a real room there may well be some CSI or BSI, as lateral room reflections will contribute to the production of interaural fluctuations. This contribution from the room will be higher if the listener is not centered. However maximum spaciousness occurs when the reverberant component of the recording is fully decorrelated. In the absence of room reflections any single pair of loudspeakers can only maximally excite spaciousness from a few frequency bands. If we want all frequencies to be equally spacious, we need an array of decorrelated loudspeakers.

From these observations we can deduce three simple rules:

For maximum spaciousness at high frequencies the reverberant component of a recording should be fully decorrelated.

The frequency band for maximum spaciousness from a stereo loudspeaker pair depends on the angle between the loudspeakers. The wider the separation the lower the first spacious frequency and the higher the perceived spaciousness.

Ideally, the reverberant component of the recording should be reproduced by an array of decorrelated loudspeakers around the listener.

The frequency dependence of the perception of spaciousness is an important reason that stereo reproduction works. If it was not possible to perceive some spaciousness from a stereo pair, there would be much less of a reason to switch from monaural. However two-loudspeaker stereo is not an optimal solution at high frequencies. Ideally, we want the reflected sound field to be diffuse—coming from all around the listener. A diffuse sound field produces maximum interaural fluctuations at all frequencies and the result is both more effective and more natural. In a typical room, lateral reflections can help spread the reverberant energy in a recording. But, if the reverberant component of the sound can be reproduced through multiple loudspeakers, the results are superior as long as the sound driving the loudspeakers is laterally decorrelated.

The behavior of spaciousness from a stereo pair below 500 Hz is much more complicated. In an anechoic environment, spaciousness is not produced nor are any ITDs greater than those produced by the front loudspeakers. However, it is immediately obvious that in a typical room some spaciousness is audible, even at low frequencies. This spaciousness comes from fluctuations in the ITDs, just as it does in a concert hall. But the method that produces these fluctuating ITDs is very different. Below 500 Hz sound travels from the loudspeakers to the listener by way of room modes, which are standing waves. As an academic aside, the Schroeder frequency is often much lower than 500 Hz, but the method for producing ITDs described here works at frequencies above the Schroeder frequency.

Room modes have interesting properties. For example, at a given position they have constant phase with respect to time (however, at a given time, the phase of a room mode or standing wave will change with location within the room). For example, assume we can drive a room with a sinusoid from a loudspeaker, and tune the frequency to a single mode of the room for example, the lowest fundamental length mode. This mode is characterized by a pressure null at the center of the room with pressure maxima of opposite sign at the two ends. If we measure the phase of the pressure in the room, we will find that the phase varies with position throughout the room (however, the phase will remain constant at any given position in the room with respect to time). The amplitude of the room mode also varies with position in the room with sign changes on opposite sides of the null in the center of the room. However, as we move the test microphone around, there is no phase shift of any kind with respect to time at any given position in the room.

This is a bizarre result. We would expect that as we move the test microphone away from the loudspeaker there would be a time delay in the pressure corresponding to the distance to the loudspeaker. This does not occur. There is no time delay at all, just a variation in the amplitude.

This lack of time delay is audible. Localization at low frequencies is almost entirely determined by the ITD, or the time difference between the two ears. If the phase of the standing wave is constant in a given position with time, there can be no ITD. Therefore, the standing wave is not localizable andit sounds as if it is located inside the head of the listener.

However, it is not entirely true that there is no ITD, even for a single standing wave. If one puts one's head exactly at the null point of the standing wave, the phase on either side of one's head is of opposite sign, which corresponds to a phase difference of 180 degrees. This also corresponds to a time difference of half the period. One would expect an odd localization shift exactly at the null point of the standing wave. Unfortunately, it is quite difficult to hear anything at all at the null point of the standing wave, because the pressure there is zero. It would appear that we could perhaps hear spaciousness at low frequencies if we could put ourselves at the exact null point of the lateral standing waves except, that in that case we would hear nothing at all.

From this we can develop two simple rules for single standing waves:

One cannot hear spaciousness from a standing wave unless one is at a pressure null.

One cannot hear spaciousness from a standing wave if one is at a pressure null.

Fortunately, this is not what happens in real rooms. In real rooms there are (nearly always) several modes in operation at the same time. In this case the results are entirely different. Consider the medial modes: These are the vertical modes and the front/back modes, and all cross modes which do not involve the lateral direction. These modes are not by themselves capable of creating an ITD, as they must excite both ears of a listener identically. However they can interfere with the lateral modes. Most important, they can create audible pressure at the pressure nulls of a lateral standing wave. The medial modes can supply enough sound pressure to make the ITD created by the lateral modes audible.

The combination of a medial mode and a lateral mode can produce a very significant and audible ITD. For a maximum result, the medial mode should have a +/−90 phase shift with respect to the lateral mode. Because, at a given position within the room all room modes have constant phase with respect to time, it is not obvious how such a phase shift can occur. However, musical sounds at low frequencies are almost never precisely adjusted to the exact center frequencies of the room modes. When the excitation and the room modes are not exactly at the same frequency, a phase shift results which is constant throughout the room. This phase shift is close to +/−90 degrees about half of the time.

Figure 4:
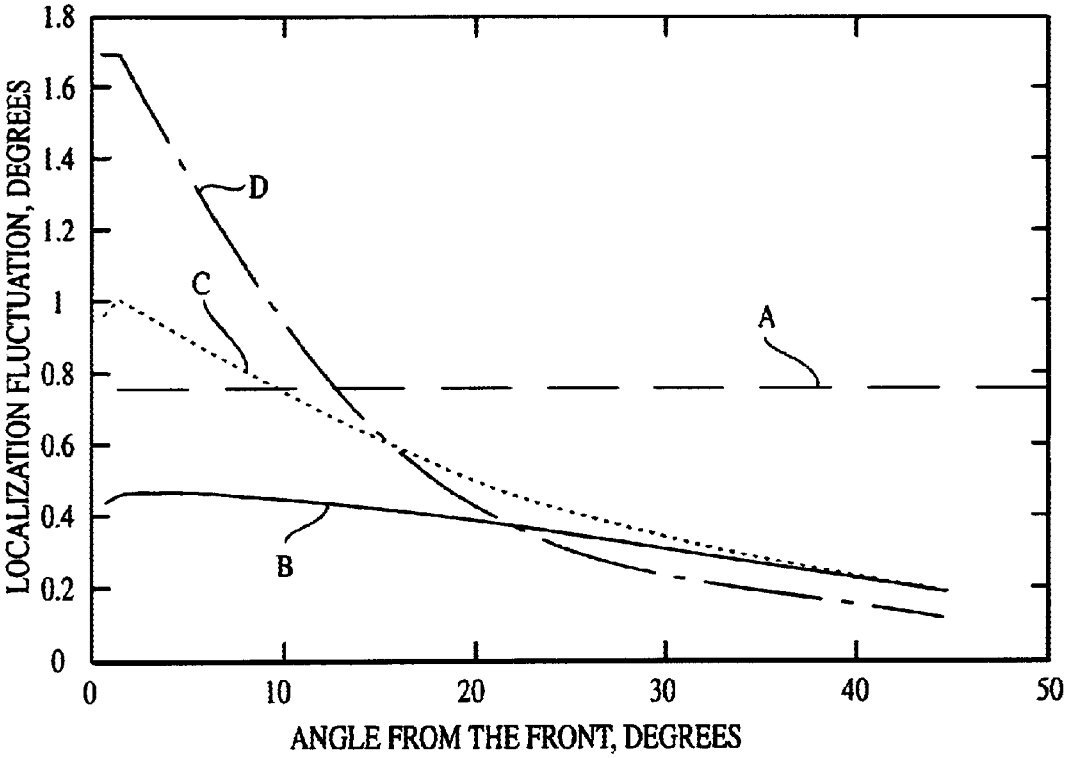
FIG. 4 illustrates the variation in interaural time differences (ITDs) from interference between an asymmetric lateral mode and a medial mode with a 90 degree phase shift.

FIG. 4 shows the results obtained from a Matlab program which investigates this interference between medial and lateral modes. The maximum ITD for a large space is shown as the broken line A. The medial mode has a 90 degree phase shift relative to an asymmetric lateral mode. When the medial amplitude is high, at 0 dB relative to the lateral mode (solid curve B), the localization fluctuations produced are fairly small. When the medial mode is 6 dB lower, shown by the dotted curve C, it is possible for the localization fluctuations to exceed the maximum for large rooms. Finally, with the medial mode at −12 dB, significantly larger fluctuations occur. This can be perceived as "phasyness".

The results of the program can be summarized as follows:

The maximum shift in ITD results when the medial mode(s) and the lateral mode differ in phase by +/−90 degrees.

The maximum shift in ITD results when the medial mode(s) is weaker than the lateral mode.

The maximum shift in ITD occurs in a broad region around the null of the lateral mode. It is not confined to exactly the null point.

The maximum shift in the ITD can be quite large, larger in fact than the maximum shift of about +/−1 ms that is created by natural hearing in large spaces.

In a lateral standing wave there can be several null points. However, for a listener in the center of the lateral dimension of a room, only asymmetric lateral modes will have a null at the position of the listener.

All asymmetric lateral modes will have a null along the center line of the room.

Asymmetric lateral modes can be created only by the antiphase component of the loudspeaker signals. Medial modes can be created only by the in-phase component of the loudspeaker signals.

Note that for shifts in the ITD, the line of lateral symmetry in a listening room becomes a location of highly unusual significance. People who take extraordinary care in setting up their room to be symmetric may be in for an unusual experience.

The following is the Matlab program used to generate the results shown in FIG. 4. In this listing, text following a percent (%) symbol is a comment.

Matlab Program for Investigating Lateral/Medial Interference

```
% program to plot the weak ITD variation from interference between
% a medial mode and a lateral mode. The phase difference between
% two modes is p, preset to pi/2. User must type in cm, or the
% medial amplitude relative to the lateral amplitude. Typical values
% are 1, 0.5, and 0.25. For plotting convenience we will assume a
% distance between the ears of 17 cm, and a base frequency of 62.5 Hz,
% yielding a ear distance of 2 radians.% speed of sound is 1100 ft/sec.
% The ITD is determined by summing the medial and the lateral waves,
% assuming constant phase within one wave. but also assuming that the
% listener is near a pressure null (and corresponding sign flip.)
% The waves are calculated in 1.2 degree steps, and then the ITD
% is determined by finding the angle where there is a positive
% zero crossing
% this program then moves the listener progressively from the null
% position in 1.2 degree steps, and plots the decrease in the ITD
```

```
% as frequency increases the ear distance in radians increases
% linearly, and thus the phase shift increases linearly. However
% the resulting time delay when you convert back to time turns out
% to be closely frequency independent. Thus we will calculate these
% effects for one frequency, 62.5 Hz. The change with distance from
% the center is plotted in degrees*2. Thus the actual distance you
% move from the null is frequency-dependent, with low frequencies
% giving very great distances, and higher frequencies less.
% a slight modification of this program can vary p, and show that
% the maximum ITD results when p=pi/2.
% define cm=medial amplitude. and df=ear delta in radians
p=pi/2;
df=0.2; % the ear distance in radians at 62.5 Hz.
% set up a for loop on the distance from the center, in half degree steps for y=1:90
% calculate the left ear and right ear amplitudes of the lateral wave
cy=2*pi*(y−1)/720; % first the amplitude angle
cl=sin(cy); % the left amplitude
cr=sin(cy−dt); % the right amplitude
a=0:720; % calculate the waves in half degree steps
a1=pi*a/360;
% now find the pressure at each ear by summing the lateral and medial
l=cl*sin(a1)−cm*sin(a1−p);
r=cr*sin(a1)−cm*sin(a1−p);
% find the zero crossing by first throwing away positive values
x=1;
if(l(x)>0)
  while (l(x)>0)
    x=x−1
  end
end
% now find the phase value of a positive zero crossing
while (l(x)>0)
  l1=x
x=x+1
end
% now do the same for the right ear
x=1;
if (r(x)>0)
  while (r(x)>0)
    x=x−1;
  end
end
while (r(x) <=0)
  r1=x;
end
% now find the ITD by comparing l1 and r1 circularly
% this routine finds the absolute value of the ITD
if (l1>600&r1<50)
  diff=720−l1−r1;
elseif (r1>600&l1<100)
  diff=720−r1−l1;
else
  diff l1−r1;
  if (diff<0)
    diff=r1−l1;
  end
end
% to make a vector of the resulting ITDs
diff1(y)=diff;
end
% convert to milliseconds from phase shift in half-degrees
time=1000*diff1/(720*62.5);
plot(time,'w')
ylabel('Max ITD shift in milliseconds')
xlabel('distance from room center in degrees*2)
```

We localize sounds at low frequencies through the ITD. It has been shown that humans can localize low frequency sounds in a room. The human localization mechanism is highly dominated by the ITD of a transient, if a transient exists in the source material. Transients are not corrupted by reflections if the room is large enough and, generally, 10 ms of reflection free time is enough. Thus we can localize a drum hit even if it has been sharply band limited to frequencies below 200 Hz (or even 60 Hz). However, not all bass instruments are drums. In fact, most bass instruments have a rather slow attack, sufficiently slow that in most playback rooms the transient is not separately detected. For these instruments, we must use the information conveyed by the room modes if we are to localize them.

We can see from FIG. 4 that it is possible to create an ITD by coupling lateral and medial modes. Consider the case when a single loudspeaker of a stereo pair emits a low frequency sound and the listener is positioned along the center line of the room. The sign of the ITD thus created is appropriate to the direction of the loudspeaker. The magnitude of the ITD, however, depends on details of the listener position and the coupling between modes. If the low frequency sound is reasonably monochromatic, it is not possible to predict what ITD will be produced. However, on the average, some plausible localization may result.

Of particular importance is the listener position in the room. If the listener is along the center line, then all asymmetric lateral modes will have a null. A single loudspeaker will excite most asymmetric modes, as well as most medial modes. There is a very good chance that an audible ITD will be produced, and the sound will appear to come from the correct side of the listener.

However as can be seen in FIG. 4, if the listener is along the center line, and medial modes are suppressed by use of a dipole loudspeaker or acoustic treatment in the room, it is quite possible that the ITD will be larger than the maximum in natural hearing. The result is an unpleasant sensation of phasyness, even with a monaural source, namely a single loudspeaker.

This was not perceived to be a problem in the days of monophonic playback, and is not a problem with stereophonic playback even now. The reason is that in a monophonic system, if the room was symmetric, the loudspeaker was also near the center line of the room. Such a loudspeaker cannot excite asymmetric lateral modes. In modem stereo systems we use two loudspeakers. They can only excite asymmetric lateral modes if they are out of phase and this condition has been rigorously avoided by most sound engineers. This is particularly true at low frequencies, which is why using two separately driven subwoofers such as 8 and 9 in FIG. 1 is often no improvement over using a single subwoofer 7 located in the middle.

In summary, it is possible to localize low frequencies in a small room, even in the absence of transients. To do it one must have a signal that is uniquely in one loudspeaker or another, and one must be near the center line of the room. Off the center line ITDs can still occur, but their magnitude (and sometimes the sign) is random. For many forms of music, the ITDs can fluctuate. The result is not localization but spaciousness.

The next group of figures illustrates a method for assessment of the low frequency spaciousness by means of a weighted sum of the ITD multiplied by the pressure, and divided by frequency. For these examples we sum over the frequency range from 30 Hz to 300 Hz.

Typical listening rooms have dimensions of about 10 to 25 feet, the walls, floor and ceiling being quite reflective at low frequencies, with absorption in the 10% range. This results in multiple reflections with little energy being absorbed, creating standing wave patterns which have pressure peaks and dips in various parts of the room. Low frequency sound propagates from the speakers to the listener through these standing waves. While the pressure at the listener position is augmented by the standing waves, this augmentation is not uniform with frequency, in general having many peaks and dips in the frequency response.

The modal patterns of small rooms were studied extensively by Sabine, Morse, Beranek and others. However, we currently are more interested in the effects produced in small rooms by a pair of loudspeakers rather than the pressure produced by a single loudspeaker in a room.

We first calculate the ITDs generated by a single loudspeaker placed 2' from a corner along the front 12' wall of a room 15' long, where the listener is 6' from the front wall and at various distances from the 15' wall nearest to the loudspeaker. The method will be described in more detail later.

Figure 5:
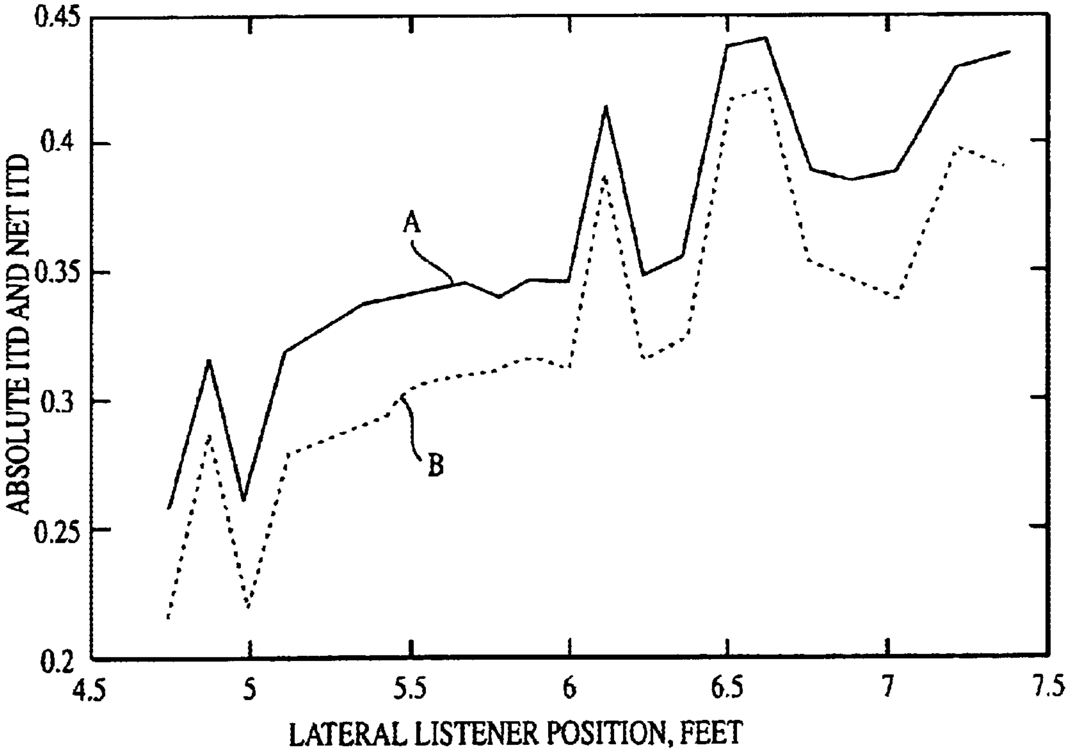
FIG. 5 shows the absolute ITD and the net ITD for a typical listening room with a wall reflectivity of 0.9 as a function of lateral listener position, using a single loudspeaker.

FIG. 5 shows the results for a room with wall reflectivity of 0.9. The solid curve A shows the absolute ITD as a function of listener position (at intervals of 1.5".) The dotted curve B shows the net ITD for the same locations. For these purposes, the absolute and net ITDs are defined by the following method:

Net__itd__sum=sum(ITD*pressure/frequency)

Absolute__itd__sum=sum(abs(ITD)*pressure/frequency)

Reference=sum(pressure/frequency)

Net__itd=Net__itd__sum/reference

Absolute__itd=Absolute__itd__sum/reference where the measured or computed ITD at each frequency is combined and weighted as indicated. The ITD can be computed from the long FFT of the impulse response at each ear, as will be described below.

Figure 6:
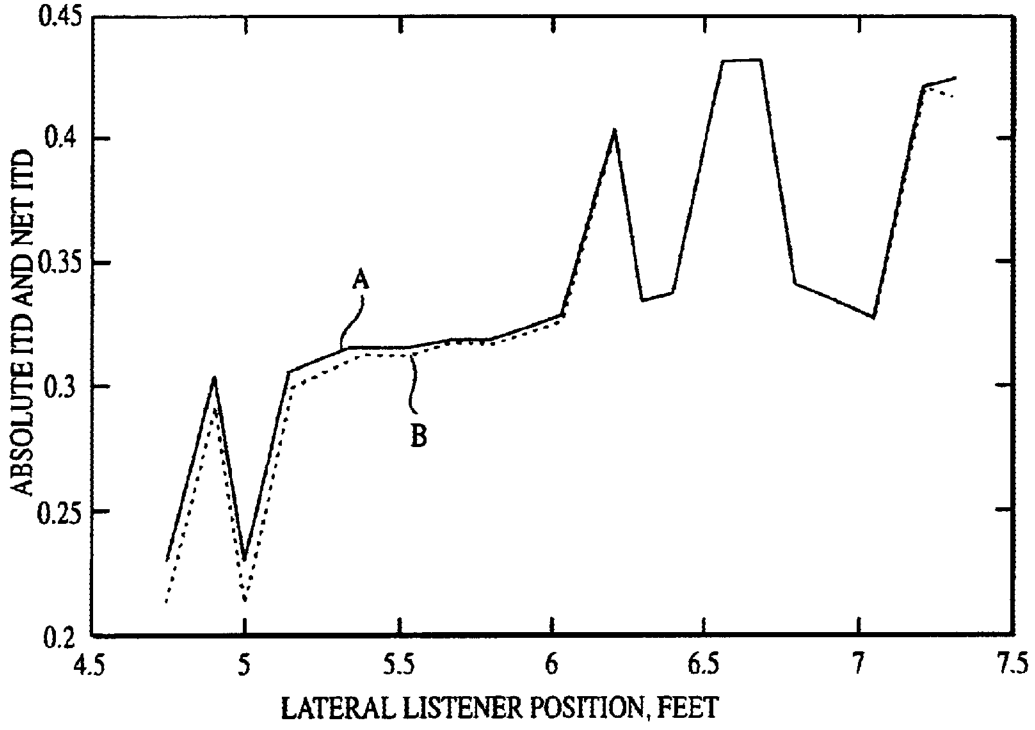
FIG. 6 shows the absolute and net ITDs when the side wall reflectivity is reduced to 0.7, as a function of lateral listener position.
Figure 7:
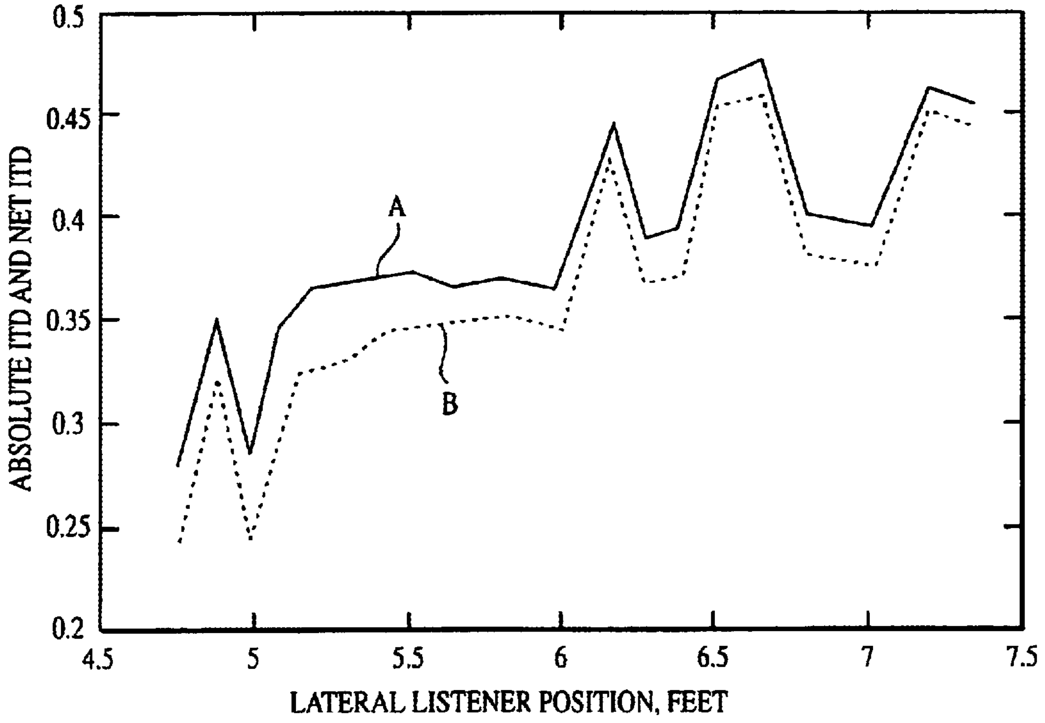
FIG. 7 shows the absolute and net ITDs in the same room as for FIG. 5 when the front and back wall reflectivity is reduced to 0.6, keeping the side wall reflectivity at 0.9, as a function of lateral listener position.

In FIG. 5, the absolute and net ITDs (A and B respectively) are similarly shaped and are high. In FIG. 6, the reflectivity of the side walls of the same room has been reduced to 0.7, with a dramatic effect on the absolute ITD curve A, which has been reduced substantially. In FIG. 7, the reflectivity of the front and back walls of the same room has been reduced to 0.6, with side wall reflectivity of 0.9. This results in an increase of both the absolute and net ITDs (A and B respectively.)

Figure 8:
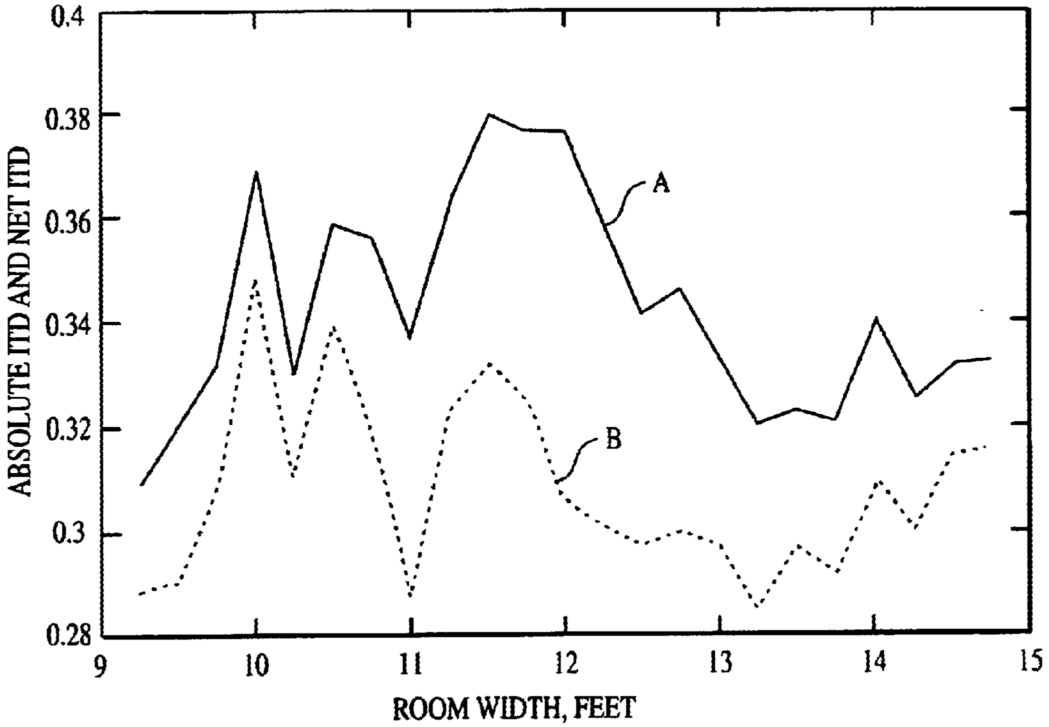
FIG. 8 shows the absolute and net ITDs in a room as a function of its width, with a constant length and for a central listener position.

FIG. 8 shows the ITDs for rooms with different widths, all 15 feet long. The single speaker is 4 feet from the center line of the room (see 4 in FIG. 1). The listener is centered and is 6.9 feet from the speaker (approximately in the same position as in FIGS. 5–7). A large peak in the net ITD curve B coincides with the "golden ratio" of 1.6:1, at a width of about 10 feet, while the absolute ITD curve A peaks at 11.5 feet–12 feet.

Figure 9:
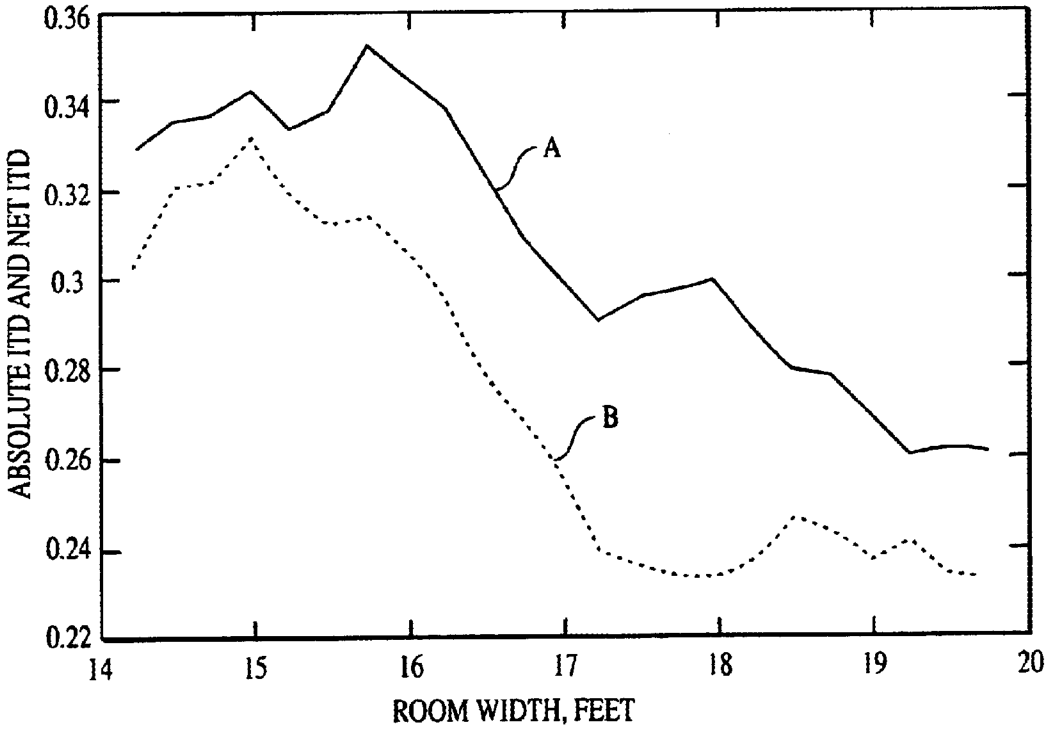
FIG. 9 shows the absolute and net ITDs for a room with larger lateral dimensions as a function of room width.

FIG. 9 shows the same length room, but with larger widths from 14' to 20'. There is a peak at 15' corresponding to a square room, but after this, both absolute ITD curve A and net ITD curve B fall off with increasing width. A corollary is that spaciousness at low frequencies is reduced when the speakers are placed on the long wall of the room.

If we excite the same room as used in FIG. 7 with two loudspeakers, one in each front corner, with the listener 6' from the front wall, with the signals in phase, it is not possible to excite odd order asymmetric lateral modes, including the lowest frequency lateral mode. Only the even order modes can be excited. When the speakers are driven in antiphase, the odd order modes can be excited, but not the even order modes.

Figure 10:
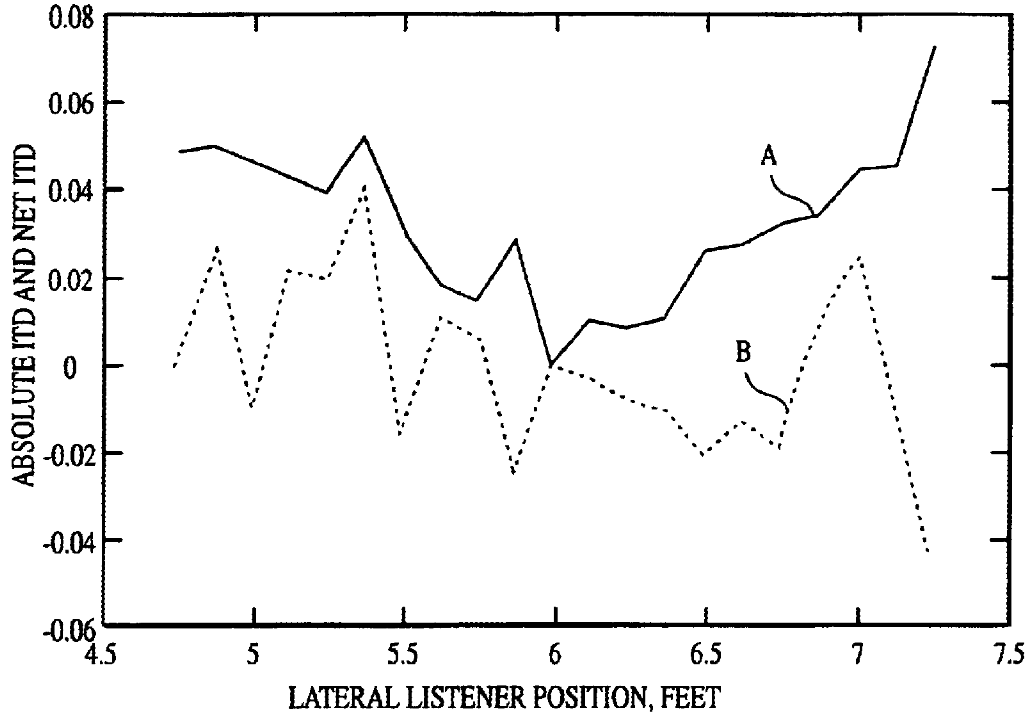
FIG. 10 shows the absolute and net ITDs in the same size room as in FIG. 5, produced by two spaced loudspeakers, as a function of lateral listener position, when the speakers are driven in phase.
Figure 11:
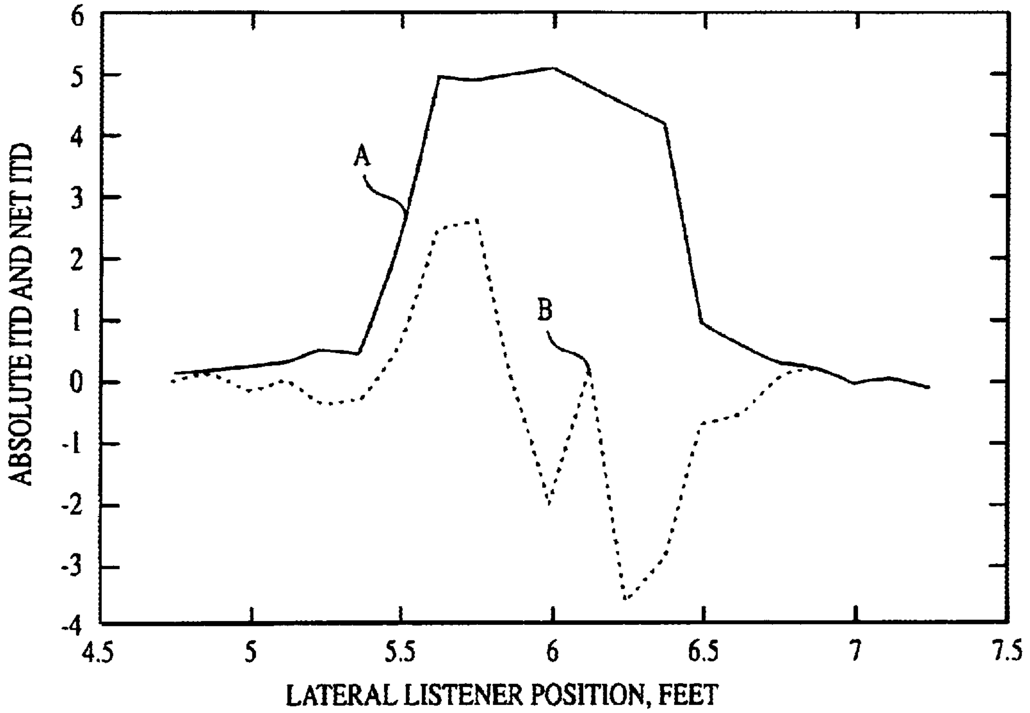
FIG. 11 shows the absolute and net ITDs in the same room but with the two speakers driven in opposite polarity, as a function of lateral listener position, showing extreme phasyness.

FIG. 10 shows the ITDs for the in-phase case, and FIG. 11 shows the ITDs for the antiphase case. In the in-phase case, the ITDs are very low and the low frequencies do not seem to fill the room but localize inside the listener's head. In the antiphase case, the absolute ITD becomes very high for a listener near the center line of the room resulting in extreme phasyness, which is uncomfortable for most people.

Because only half of the lateral room modes are excited in either case, the frequency response is more uneven than when all the room modes are driven, as if by a single loudspeaker. For these reasons, it has been recommended that when two subwoofers are used, they should be placed together in one comer of the room. This is not possible with full-range loudspeakers.

Figure 12:
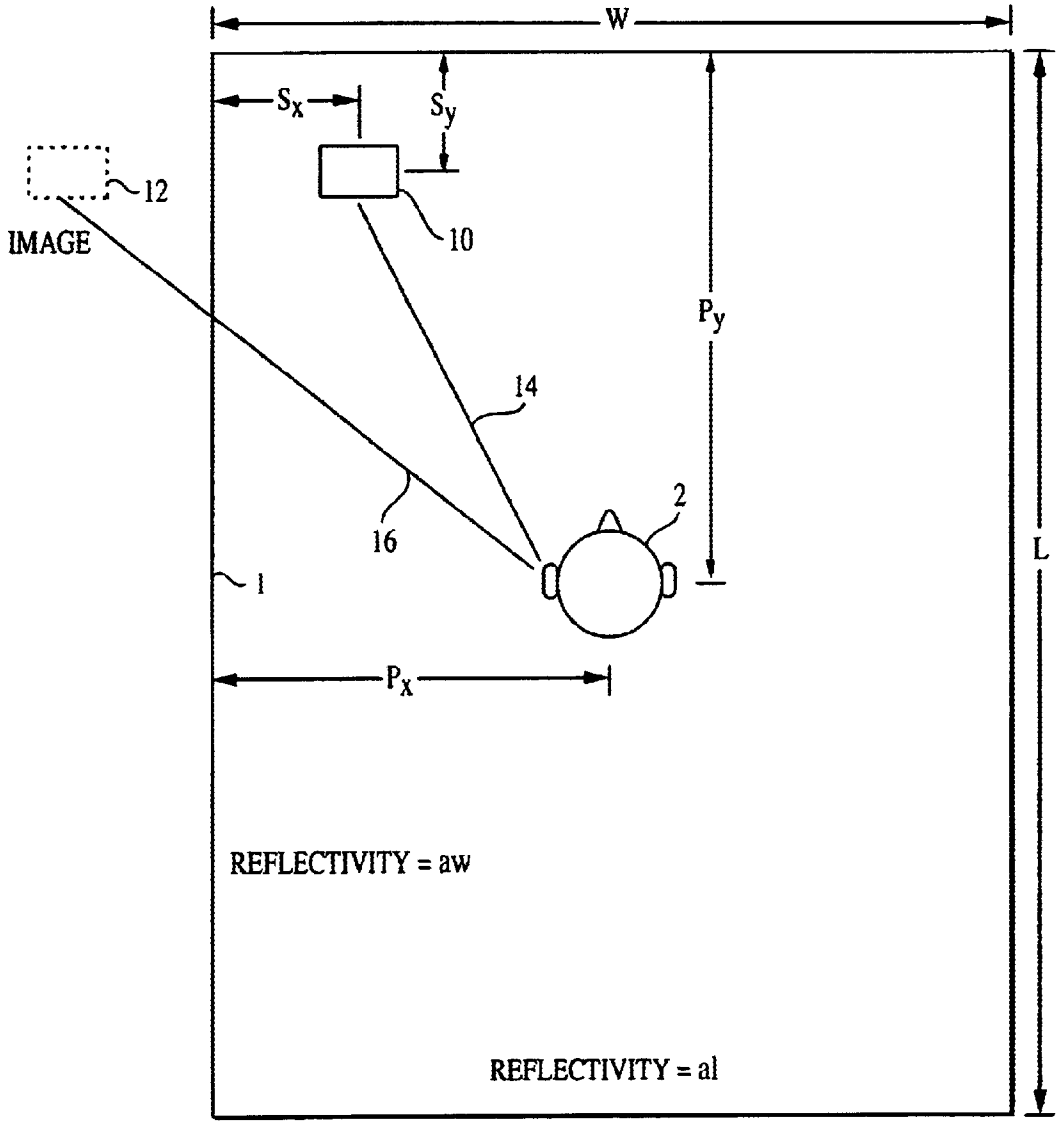
FIG. 12 illustrates a method for computing the impulse response of a room for each ear, as a function of listener and speaker positions, wall reflectivities, and image locations.

We will now look at the assumptions and methods used to calculate the ITDs in the previous discussion. FIG. 12 shows a listening room 1, with a listener 2 situated at distances $P_x$ from the left wall and $P_y$ from the front wall. A single loudspeaker 10 is situated at $S_x$ from the left wall and $S_y$ from the front wall. Assuming that the walls are highly reflective, the side wall reflectivity being aw and the front and back walls having reflectivity al, there is a reflection in the left side wall that produces an apparent image 12 of the speaker (shown dotted). Sounds reach the listener directly from the speaker via path 14 and from the image via path 16. These two different paths are of different lengths. Additionally, there are many other paths which can be excited by the multiple images of the loudspeaker produced by the reflections in the various walls of the room. Each of these reflections is attenuated by varying amounts and is delayed by various times.

If the loudspeaker is driven with a very short impulsive sound, each reflected impulse being plotted at its arrival time and with the amplitude dependent on its attenuation, we obtain the impulse responses for the left and right ears, as shown in FIG. 12. These are slightly different, as the speaker is not placed symmetrically in the room.

Figure 13:
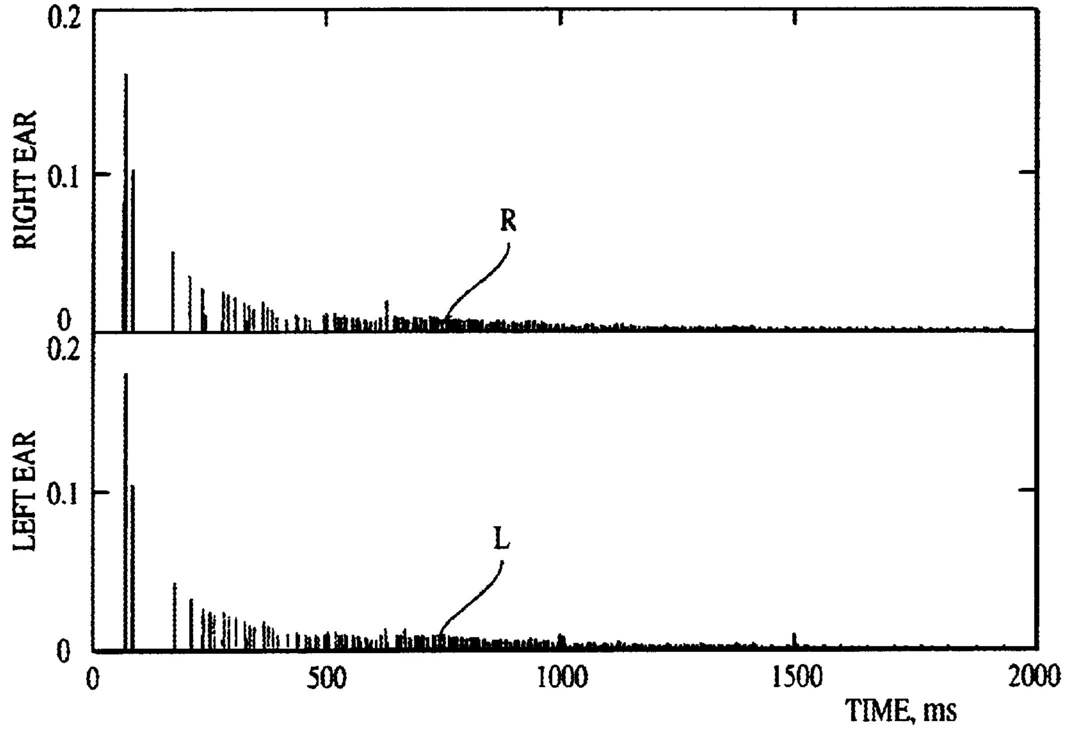
FIG. 13 shows a typical impulse response calculated for the left ear and the right ear.
Figure 14:
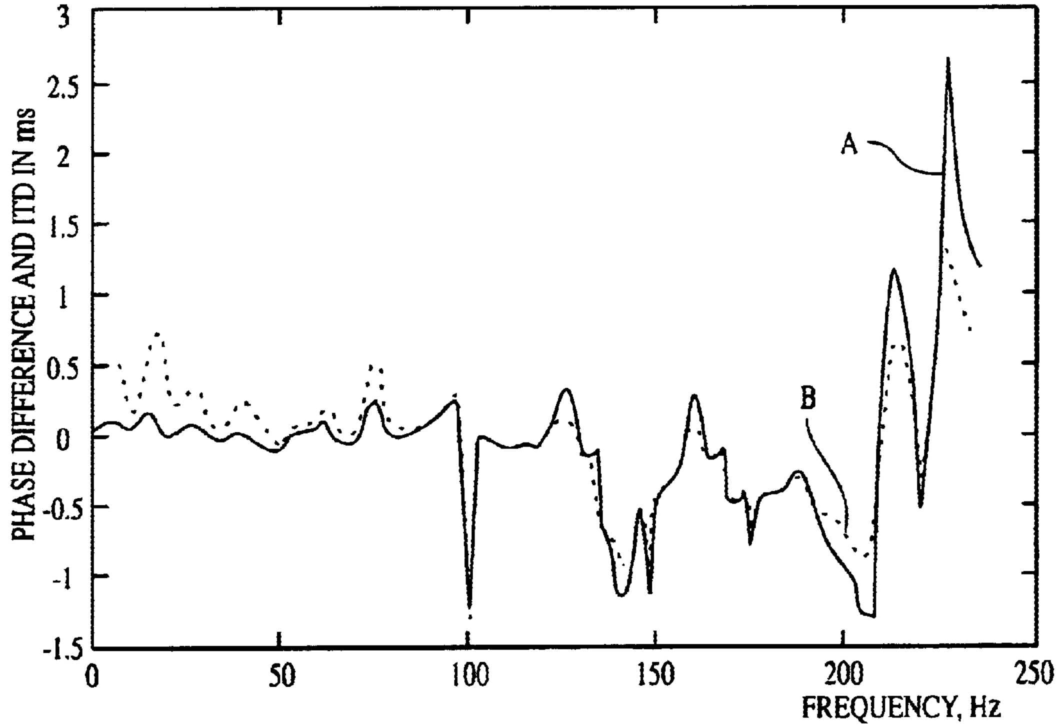
FIG. 14 shows the ITD and phase difference between the left and right ears as a function of frequency, calculated from the FFT of the impulse responses.

In FIG. 13, the phase difference (solid curve A) and interaural time difference (dotted curve B) are shown as a function of frequency, these being derived from the impulse responses as in the following Matlab program, using a long FFT:

```
FTL=FFT(left impulse response)
FTR=FFT(right impulse response)
phase__left=arctan(imag(FTL)/real(FTL))
phase__right=arctan(imag(FTR)/real(FTR))
for x1=1:500
phase__diff(x1)=phase__left(fftl(x1))−phase__right(fftr(x1));
if phase__diff(x1)>0
  if phase__diff(x1)>pi
    phase__diff(x1)=phase__diff(x1)−2*pi;
  end
else
  if phase-diff(x1)<−pi
    phase__diff(x1)=phase__diff(xi)+2*pi;
  end
```

```
end
end
delfrq=5000/4096
deltime=phase__diff./(2*pi*delfrq*n)
```

The object of this invention is to enable both loudspeakers in the room to excite all of the room modes. To do this, the speakers cannot be driven in phase, as they will then fail to excite the odd lateral room modes, but neither can they be driven in antiphase, which would not allow the even modes to be excited. There is, however, an alternative. If the speakers are excited in a quadrature or 90 degree phase relationship, the sounds from each loudspeaker are orthogonal in the wave space and each speaker therefore excites all the room modes independently. Only when the symmetry is imperfect can some of the modes be canceled between the speakers, or if the phase difference is not exactly 90 degrees.

Constant phase differencing networks are well known in the art, and are usually designed to approximate a quadrature phase difference between the left and right output over a given range of frequencies. For a single decade of frequencies, in this case between 20 Hz and 200 Hz, the phase difference may be made nearly constant using only one pole in each of a pair of all-pass phase shifters. More complex arrangements can be made, using two or more poles per network. The advantage of additional poles would be to reduce the inevitable phase difference at frequencies outside the band of interest. Ideally, the phase difference should be essentially zero above about 400 Hz.

According to the invention, the circuit 30 of FIG. 15 includes a phase shifter comprising op-amp U1, resistors R1–R3 and capacitor C1, this being driven from a first input terminal 32. A second phase shifter comprising op-amp U3, resistors R6–R8 and capacitor C3, is driven from the second input terminal 34. With the values shown, the signal in the first channel is transmitted through U1 with a phase inversion at low frequencies, but at high frequencies the signal is passed in phase to the output. At the natural frequency associated with the C1–R2 time constant, the phase shift is 90 degrees. The amplitude response is exactly unity gain for all audio frequencies (subject to tolerances of the resistors.) Similarly, for the second channel, the phase shift becomes 90 degrees at a lower frequency than that in the first channel. Between these two frequencies, and for some little range outside them, the phase shift between the two outputs remains at or close to 90 degrees.

Thus the circuit of FIG. 15 provides two outputs from the op-amps U1 and U3 that are in quadrature phase relationship over a significant range of frequencies.

Because the room modes are all being excited by both loudspeakers, there is a considerable increase in the bass energy in the room. As the loudspeakers are normally expected to be used in a phase-coherent relationship and are designed to give a flat bass response in this mode of operation, when their sound pressure levels sum in phase, the use of a quadrature phase between them at low frequencies will reduce the coherent bass output level by 3 dB . Therefore, it is necessary to re-equalize the room response by performing a 3 dB boost at the lower frequencies, in both channels.

In the first channel, the output signal from op-amp U1 is passed to the boost stage comprising op-amp U2, resistors R4 and R5, and capacitor C2. At high frequencies, C2 has low impedance, and the gain through this stage is unity (0 dB). At low frequencies, the gain is (R5/R4+1), or 1.34, approximately 3 dB. The roll-off frequency is chosen to match the effect of the increasing phase difference between the two channels in the transition region between about 400 Hz and 200 Hz. The output of this boost stage is applied to a first output terminal 36 of the circuit 30.

An identical boost stage comprising op-amp U4, resistors R9 and R10, and capacitor C4, is placed in the second channel to receive the signal from op-amp U3, and the output of op-amp U4 is applied to the second output terminal 38 of circuit 30 of FIG. 15.

Figure 16:
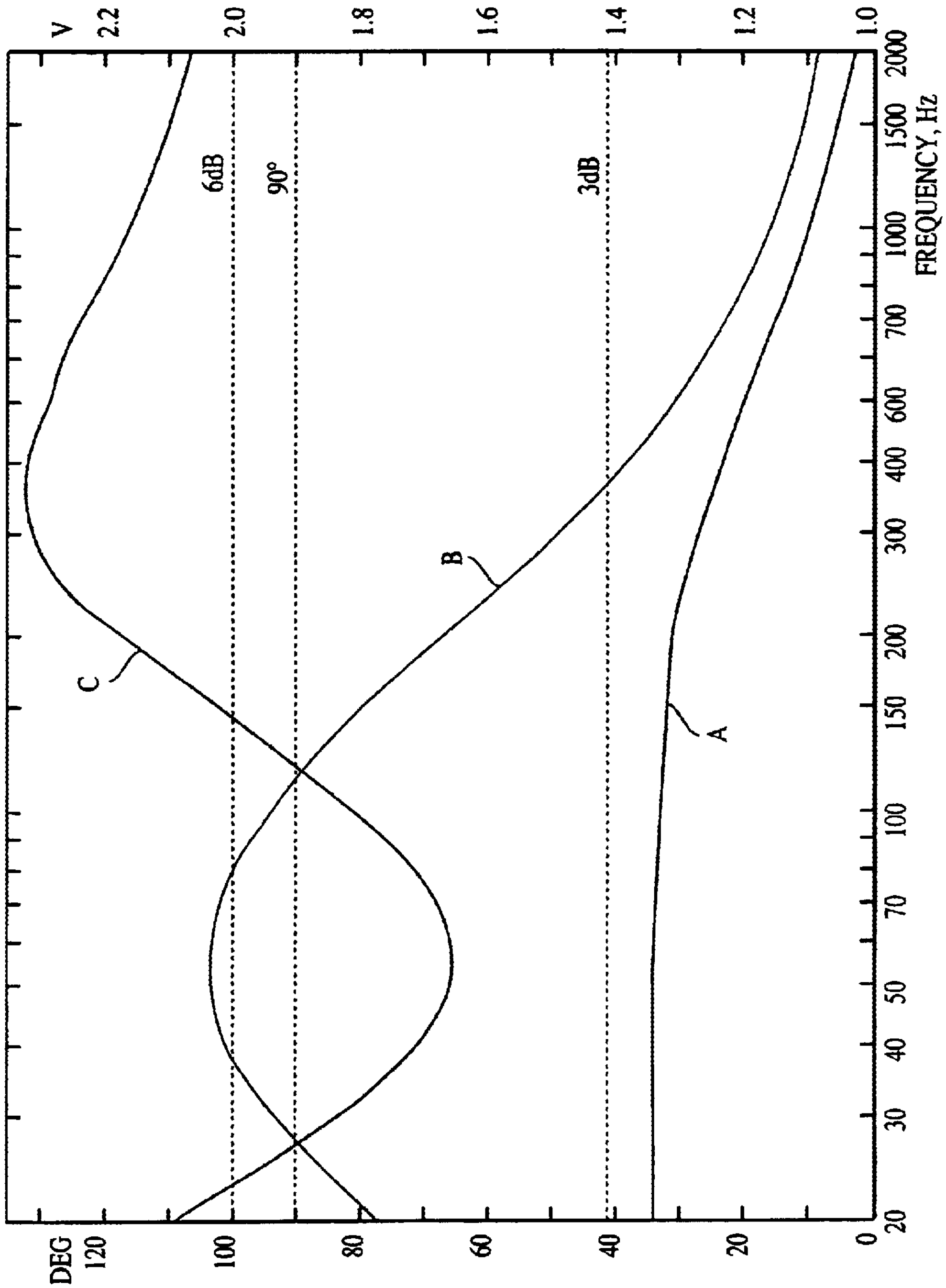
FIG. 16 shows the absolute gain (equal in both channels) and the phase difference between the left and right channel outputs of the circuit of FIG. 15 when the two inputs are driven in common, as a function of frequency.

FIG. 16 shows the frequency response and the phase difference plotted against frequency, and also the amplitude produced when the channels are summed together. Curve A shows the output amplitude, for 1V AC input, which is 1.34V at low frequencies, and falls off to 1.09 at 2 kHz (asymptotic to 1.0V at high frequencies. Both channels have identical frequency response, as the delay stage is all-pass and only the boost stage has additional low frequency gain.

Curve B shows the phase difference between the outputs generated by a PSPICE simulation. Between approximately 150 Hz and approximately 200 Hz, the phase remains within about 14 degrees of the desired 90 degree phase shift. Above 300 Hz, where the phase difference is 45 degrees, the phase difference falls rapidly and becomes about 30 degrees at 500 Hz and below 20 degrees at 1000 Hz.

The effect of the boost is shown in curve C, which represents the sum of the voltages applied to the two loudspeakers, which approximately represents the low frequency sound pressure level in the room. This sum is 2.0V at all high frequencies and varies from this value by ±0.34V in the low frequency region where the phase shift networks and the boost circuits are operational. Thus, the bass is equalized to the same level as would be produced by coherent phase loudspeakers. Because more bass energy is coupled to the room modes, the actual bass level in the room may be higher off the center line of the room.

The purpose of this invention is to produce the same increase in perceived spaciousness and externalization for a single channel source, or for a recording where the low frequency energy has been recorded in monaural in both stereo channels. These recordings are the rule for popular music. Adding the phase shift does not reduce the strength of the spaciousness for true stereo material, it only increases the effect for monaural material. A method of predicting the increase in spaciousness based on the properties of the room modes is presented in the reference quoted below. A complete mathematical formulation of this theory, which can be used to support the claimed increase in spaciousness from the 90 degree phase shift, was presented orally at the AES convention mentioned in the reference. However the use of a phase shift for this purpose was deliberately not mentioned in the talk.

This increase in spaciousness has been noticed before by many listeners using a standard full range system when a recording is played which includes a lot of reverberation at low frequencies. The reverberation (which tends to have a rapidly varying random phase relationship) produces a non-zero phase relationship between the two loudspeakers, and this effectively excites the asymmetric modes. In this case the low frequencies seem to be located around the listener, not inside the head.

As mentioned previously, this is not the only possible embodiment of the invention. It would be possible to use four or six-pole phase difference networks to obtain tighter control of the phase shift in the bass.

As mentioned in the background section above, during testing of the invention it became clear that there was some advantage to reducing the phase shift to zero for the duration of sharply rising low frequency transients. There is also reason to believe that direction sensing circuitry such as is used in matrix surround technology can be used to choose the channel to which the lead in phase should be applied. Simply detecting which channel was louder and causing the phase shift to lead in this direction will improve low frequency localization in most systems. It will also improve envelopment. When neither channel leads on the average, it is probably best to choose the right channel as the lead channel.

The nature of the circuitry shown in FIG. 15 also lends itself to use within a pair of powered loudspeaker systems each having within the loudspeaker enclosure either the first or second channel circuitry of FIG. 15 and an audio power amplifier for driving the loudspeaker.

In other embodiments it is contemplated that the phase relationship may be varied to produce the desired phase degree differences mechanically. For example, the phase relationship varying may be accomplished by mechanical manipulations of the loudspeaker enclosure volume, driver cone mass, port area and geometry, and crossover design, that combine to produce the desired 90 degree phase difference in the pressure output of the loudspeakers.

While the preferred embodiments of the invention have been described and illustrated herein, many other possible embodiments exist, and these and other modifications and variations will be apparent to those skilled in the art, without departing from the spirit of the invention.

What is claimed is:

1. A system for maintaining a phase relationship between a pressure output of a first loudspeaker system and a pressure output of a second loudspeaker system in a listening room including, a signal processor for driving first and second power amplifiers and the first and second loudspeaker systems, the system comprising:

first and second input terminals adapted to receive a stereophonic pair of audio input signals, where the stereophonic pair of audio input signals comprise a first audio input signal and a second audio input signal, where the first and second audio input signals comprise a low frequency audio signal;

corresponding first and second output terminals for producing a stereophonic pair of output signals for driving the first and second power amplifiers and the first and second loudspeaker systems to produce the pressure outputs, where the stereophonic pair of output signals comprises a first output signal and a second output signal;

circuitry for varying a phase relationship between the first and second output signals such that a phase difference between the first and second output signals tends towards zero when the output signals contain audio frequencies above approximately 400 Hz and increases to approximately quadrature when the output signals contain audio frequencies below between approximately 200 Hz and approximately 150 Hz comprising, a first portion and a second portion; where the first portion is located between the first input terminal and the first output terminal and the second portion is located between the second input terminal and the second output terminal and where the first and second portions each comprise a gain, where the gain is approximately constant at all audio frequencies, thereby providing increased apparent spaciousness for low frequency sounds resulting from the pressure outputs of the first and second loudspeaker systems in the listening room.

2. The system of claim 1 further comprising:

a circuit between each input terminal and the corresponding output terminal where the circuit applies an equal bass boost of approximately 3 dB to the output signals containing audio frequencies below between approximately 200 Hz and approximately 150 Hz, thereby maintaining approximately constant sound pressure at all frequencies for the pressure outputs along a lateral center line running from a front to a back of the listening room.

3. The system of claim 1 where said approximately quadrature phase relationship between the first and second output signals is maintained for the output signals containing audio frequencies of approximately 20 Hz to between approximately 150 Hz and approximately 200 Hz, reducing to zero gradually as the audio frequencies contained in the output signals increase above approximately 200 Hz.

4. The system of claim 1 where the first portion and the first power amplifier are contained within the first loudspeaker system, and the second portion and the second power amplifier are contained within the second loudspeaker system.

5. The system of claim 1 further comprising:

second circuitry for detecting rapidly increasing low frequency transients in the output signals; and third circuitry for reducing the phase relationship between the first and second output signals to zero for a duration of said low frequency transients.

6. The system of claim 1 further comprising:

fourth circuitry for detecting an average amplitude of the low frequency audio signals in each of the first and second input audio signals; and fifth circuitry for establishing the phase difference by causing whichever of the first or second audio input signals that has a larger average amplitude to lead the other.

7. The system of claim 6 where the fifth circuitry comprises first and second all-pass phase shift circuits, where each all-pass phase shift circuit comprises an input and an output; and where the input of each all-pass phase shift circuit is connected to the corresponding first and second input terminals and the output of each all-pass phase shift circuit is connected to the corresponding first and second output terminals.

8. The system of claim 7 further comprising:

first and second bass boost circuits interposed between the outputs of the first and second all-pass phase shift circuits and the corresponding first and second output terminals and providing a boost of approximately 3 dB to the output signals containing low audio frequencies where a phase relationship between the outputs of the first and second all-pass phase shift circuits is approximately in quadrature.

9. The system of claim 7 further comprising:

means for detecting an onset of low frequency transients having equal amplitudes in both the first and second input signals; and means for temporarily reducing the phase difference between the first and second output signals to zero for a duration of the low frequency transients having equal amplitudes in both the first and second input signals.

10. A method for increasing an apparent spaciousness of low frequency sounds reproduced by a stereophonic pair of left and right loudspeakers in a listening room comprising the steps of:

applying a varying relative phase shift between sounds reproduced by the left and right loudspeakers such that a relative phase difference between the sounds is approximately zero at high frequencies increasing to approximately 90 degrees at frequencies below between approximately 200 Hz and approximately 150 Hz, while relative amplitudes of the sounds are maintained at all frequencies;

locating the left and right loudspeakers with lateral symmetry in left front and right front corners of the listening room, thereby providing independent excitation of all low frequency modes of the listening room by both the left and right loudspeakers.

11. The method of claim 10 further comprising the steps of:

applying a bass boost of approximately 3 dB to the sounds reproduced by the left and right loudspeakers at frequencies for which the relative phase difference is approximately 90 degrees, where the bass boost falls to 0 dB for sounds reproduced by the left and right loudspeakers which are in phase.

12. The method of claim 10 further comprising the steps of:

detecting low frequency transients which are approximately equal in left and right audio input signals; and temporarily removing the relative phase shift between the sounds reproduced by the left and right loudspeakers for a duration of the low frequency transients which are approximately equal in the left and right audio input signals.

13. The method of claim 10 where applying a varying relative phase shift further comprises the steps of:

determining an average level of low frequency components of left and right audio input signals;

establishing the relative phase difference between the sounds reproduced by the left and right loudspeakers by causing whichever of the right or left audio input signals has a larger average level of low frequency components to lead the other.

14. A system for maintaining a phase difference between pressure outputs of loudspeakers in a listening room, comprising in an electronic case of a signal processing system for driving first and second power amplifiers and first and second loudspeaker systems in a listening room, comprising:

first and second input terminals adapted to receive a stereophonic pair of audio input signals;

corresponding first and second output terminals for producing a stereophonic pair of output signals for driving the first and second power amplifiers and the first and second loudspeaker systems; and means for varying the phase relationship between the first and second output signals such that their phase difference tends towards zero at audio frequencies above approximately 400 Hz and increases to an approximately 90 degrees phase difference at frequencies below between approximately 200 Hz and approximately 150 Hz, the gain of the circuitry between each input terminal and the corresponding output terminal being approximately constant at all audio frequencies, thereby providing increased apparent spaciousness of low frequency sounds reproduced by said loudspeakers in the listening room.

15. The system of claim 14 where the means for varying the phase relationship comprises mechanical manipulations of a loudspeaker enclosure volume, driver cone mass, port area and geometry, and crossover design, that combine to produce the approximately 90 degree phase difference in the pressure output of the loudspeakers.

* * * * *

UNITED STATES PATENT AND TRADEMARK OFFICE

CERTIFICATE OF CORRECTION

PATENT NO. : 6,683,962 B1
DATED : January 27, 2004
INVENTOR(S) : David H. Griesinger It is certified that error appears in the above-identified patent and that said Letters Patent is hereby corrected as shown below:

Column 1,
Line 67, delete “frequency,the” and substitute -- frequency the -- in its place.

Column 4,
Line 53, before “symmetrically” delete “place” and substitute -- placed -- in its place.

Column 9,
Line 17, before “sounds” delete “andit” and substitute -- and it -- in its place.

Column 10,
Lines 37-38, delete “Matlab Program for Investigating Lateral/Medial Interference” and substitute (center title):
-- Matlab Program for Investigating Lateral/Medial Interference --
in its place.

Column 12,
Line 56, after “In” delete “modem” and substitute -- modern -- in its place.

Column 14,
Line 32, after “being” delete “aw” and substitute -- *aw* -- in its place, and
Line 33, after “reflectivity” delete “al” and substitute -- *al* -- in its place.

Column 16,
Line 13, after “high” delete “frequencies.” and substitute -- frequencies). -- in its place.

Signed and Sealed this

Third Day of May, 2005

JON W. DUDAS
*Director of the United States Patent and Trademark Office*